United States Patent [19]

Sichart

[11] 4,059,809

[45] Nov. 22, 1977

[54] DIFFERENTIAL AMPLIFIER

[75] Inventor: Frithjof V. Sichart, Munich, Germany

[73] Assignee: Siemens Aktiengesellschaft, Munich, Germany

[21] Appl. No.: 607,586

[22] Filed: Aug. 25, 1975

[30] Foreign Application Priority Data

Aug. 27, 1974 Germany .............................. 2440937

[51] Int. Cl.² .............................................. H03F 3/45
[52] U.S. Cl. .................................... 330/253; 330/277
[58] Field of Search ................ 330/30 D, 35; 307/304

[56] References Cited

U.S. PATENT DOCUMENTS

| | | | |
|---|---|---|---|
| 3,663,888 | 5/1972 | Greene | 330/35 X |
| 3,700,981 | 10/1972 | Masuhara et al. | 330/35 X |
| 3,775,693 | 11/1973 | Proebsting | 307/304 X |

OTHER PUBLICATIONS

Axelrod, "Speed-Up Circuit for NOR Circuits Using Insulated-Gate, Field-Effect Transistors," IBM Technical Disclosure Bulletin, vol. 7, No. 2, July 1964, pp. 168, 169.

*Primary Examiner*—James B. Mullins
*Attorney, Agent, or Firm*—Schuyler, Birch, Swindler, McKie & Beckett

[57] ABSTRACT

A differential amplifier constructed from at least two metal oxide semiconductor (MOS) transistors is described. Input voltages are individually applied to the control electrodes of the transistors. The source-drain paths of the transistors are connected in series at a common junction point, and the other terminals thereof are connected to a supply voltage. The differential output voltage is taken from the aforementioned common junction point.

6 Claims, 1 Drawing Figure

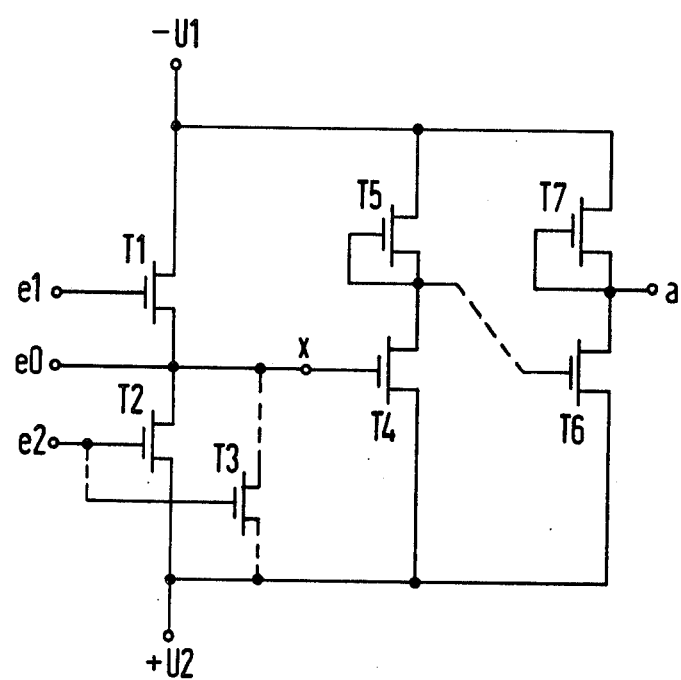

DIFFERENTIAL AMPLIFIER

BACKGROUND OF THE INVENTION

This invention relates to differential amplifiers which are a form of operational amplifiers and are employed in connection with the amplification and comparison of signals. Basically, differential amplifiers comprise two amplifying elements having, respectively, one electrode connected to an electrode of the other amplifier, separate voltages being applied at the control electrodes thereof which, where required, shall be compared with one another.

In a differential amplifier of known construction (cf. "Elektronik," 1970, No. 5, pp. 145-148) bipolar transistors are used as amplifying elements. The amplifier is part of an integrated circuit, and, thus, is comparatively small. However, a differential amplifier constructed in this manner cannot readily be applied to modern integrated circuits comprising metal oxide semiconductor (MOS) transistors.

A differential amplifier circuit is known which comprises field effect transistors disposed in the input circuit (cf. "Electronics," June 21, 1971, pp. 76-80) wherein one of two voltages being compared is applied to the gate electrodes thereof. However, at the output a conventional output amplifier is connected downstream of the field effect transistors. The output amplifier is composed of bipolar transistors, so that this known differential amplifier cannot readily be applied to integrated circuits in conjunction with the MOS transistors widely used at the present time.

An object of the invention is, therefore, to provide a differential amplifier of very simple construction, which can readily be used for integration in a circuit arrangement comprising MOS transisitors.

SUMMARY OF THE INVENTION

In accordance with the invention, the foregoing and other objects are achieved in a differential amplifier having at least two transistors, to the control electrodes of which control voltages are applied. Only MOS transistors are used which, with their source-drain paths connected in series, are connected to a supply voltage and which at the common junction point in the series connection allow the generation of an output voltage. The control voltages are applied to the gate electrodes of both MOS transistors.

The invention has the advantage that it can be carried into effect solely using MOS transistors. This is particularly propitious for embodying such a differential amplifier in a circuit arrangement comprising MOS transistors. It is particularly of great advantage in an analog-to-digital converter operating according to the iterative process in which, among other things, a comparator is required, which frequently employs a differential amplifier (cf. West German patent application Ser. No. 23 15 986.6-31).

According to an advantageous development of the invention, one MOS transistor is of the depletion type and the other of the enhancement type. As a result, the advantage is obtained in order to produce a specified output voltage, control voltages can readily be operated upon whose absolute values differ rather greatly from one another.

According to another advantageous development on the invention, MOS transistors are used which have threshold voltages such that, in order to obtain a given output voltage in the presence of control voltages that are equivalent to one another and are applied at the gate electrodes of both MOS trasistors, the differential voltages resulting from the relevant gate/source voltage less the relevant threshold voltage are equally large. This results in the advantage that within a relatively large range of variations of the control voltages which are equivalent to one another, one and the same output voltage is always received. This means that the circuit arrangement is linear in this respect.

According to a further development of the invention, the threshold voltages of both MOS transistors are so applied through ion implantation that in order to obtain a specified output voltage in the presence of control voltages which are equivalent to one another and are applied at the gate electrodes of both MOS transistors, the differential voltages resulting from the relevant gate/source voltage less the relevant threshold voltage are equally large. In this way, one has the advantage that in order to obtain a given output voltage, control voltages can relatively easily be operated upon, whose absolute values do not differ from one another.

According to another advantageous development of the invention, the electrodes of a depletion MOS transistor are parallel connected to corresponding electrodes of the enhancement MOS transisitor. The resulting advantage is a small number of switching elements needed for obtaining a specified output voltage during the processing of control voltages whose absolute values do not differ from one another.

According to an additional development of the invention, the input of an amplifier comprising at least one stage is connected to the junction point between the source-drain paths of both MOS transistors. From the output of the differential amplifier an amplified output signal can be received and upon the appearance of a specified output voltage at the junction point between the source-drain paths of both MOS transistors, due to the existence of control voltages which are equivalent to one another, the amplifier switches from one state to its other state. The resulting advantage is a particularly distinctive switching behavior for the entire switching arrangement.

According to still another advantageous development of the invention, the amplifier is made up of MOS transistors. This enables one to integrate the entire circuit in a simple way, that is, particularly in conjunction with a switching configuration comprising MOS transistors requiring, among other things, a differential amplifier.

In the context of an amplifier made up of field effect transistors, it is old (cf. U.S. Pat. No. 3,714,466) to connect the input of the amplifier to the junction point between the source-drain paths of two field effect transistors placed in parallel with one another and disposed with their electrodes not connected to the common junction point in a supply voltage source. However, the field effect transistors form a push-pull stage in which the gate electrode of one field effect transistor is directly energized from an input signal, while the gate electrode of the other field effect transistor is energized from the input signal over a field effect transistor functioning as an inverter. At any rate, the push-pull stage does not function as a differential amplifier.

According to another advantageous development of the invention, the junction point between the source-drain paths of both MOS transistors is connected to a control device supplying an offset voltage. The resulting advantage resides in the fact that the switch point of the amplifier connected downstream of the differential amplifier can be adjusted very precisely.

BRIEF DESCRIPTION OF THE DRAWING

The principles of the invention will be more readily understood by reference to the description of a preferred embodiment given hereinbelow in conjunction with a single FIGURE of drawing which is a schematic diagram of a differential amplifier constructed according to the invention.

DETAILED DESCRIPTION OF THE PREFERRED EMBODIMENT

The circuit configuration shown in the drawing comprises as essential components two MOS transistors T1 and T2 having source-drain paths connected in series through a reference value junction point with the nonjoined terminals being connected to a supply voltage source. The MOS transistor T1 has one drain connected to a terminal $-U1$, and the source of the MOS transistor T2 is connected to a terminal $+U2$. The terminal $-U1$ may have a voltage of, e.g., $-5V$, and the terminal $+U2$ a voltage of, e.g., $+5V$. The source terminal of the transistor T1 is connected to the drain terminal of transistor T2. This junction point is connected to reference value $e_0$. It is assumed that the MOS transistor T1 in this embodiment is a p-channel depletion MOS field effect transistor, and the MOS transistor T2 is a p-channel enhancement MOS field effect transistor.

The gate electrode of the MOS transistor T1 is connected to an input terminal $e1$, and the gate electrode of the MOS transistor T2 is connected to an input terminal $e2$. The portion of the configuration shwon in FIG. 1, and discussed thus far, constitutes a differential amplifier. It facilitates the processing of control voltages applied to the input terminals $e1$ and $e2$, such that it generates at the junction point between the source-drain paths of both MOS transistors T1 and T2 an output voltage proportional to the difference between the control voltages applied at the input terminal $e1$ and $e2$. A control voltage can be applied to the gate electrode of the MOS transistor T1, which fluctuates between a positive and a negative value, since the $I_D - V_G$ characteristic curve ($I_D$: drain current, $V_G$: gate electrode voltage) holds true for a given constant drain and source voltage both in the region of positive and in that of negative gate electrode voltage. In the present case, a positive or a negative control voltage can also be applied to the gate electrode of the MOS transistor T2.

On the output side of the differential amplifier described hereinabove, an amplifier is connected downstream having single stages which are also composed of MOS transistors. Basically, an amplifier stage comprises a MOS transistor functioning as a control element (e.g., MOS transistor T4) and a load element likewise composed of a MOS transistor (e.g., MOS transistor T5). Here, both MOS transistors T4 and T5 may be formed by p-channel enhancement MOS field effect transistors or by p-channel depletion MOS field effect transistors.

The gate electrode of the MOS transistor T4 is connected to the output terminal $x$ of the differential amplifier described earlier. Where necessary, other appropriately constructed amplifier stages may be connected to the junction point between the drain of the MOS transistor T4 and the source and gate electrode of the MOS transistor T5, as indicated by a broken line. In the present case, it is assumed that another amplifier stage is connected to the amplifier stage described above and comprises the MOS transistors T6 and T7. The output terminal $a$ of the entire circuit configuration is connected to the junction point between the drain of the MOS transistor T6 and the source and the gate electrode of the MOS transistor T7.

The amplifier described hereinabove responds when a prespecified value appears at the output terminal $x$ of the differential amplifier and, in turn, generates an appropriate output signal at the output terminal $a$. This amplifier has a distinctive switching behavior, and this behavior can be improved by increasing the number of series-connected amplifier stages.

A very specific (e.g., positive) output signal appears at the output terminal $a$, when the input voltage applied to the gate electrode of the MOS transistor T4 exceeds a predetermined value, i.e., the "switching value" of the amplifier. It is assumed that in this embodiment the voltage corresponding to the switching value is the voltage applied at the junction point between the source and drain regions of both MOS transistors T1 and T2 whenever the voltages resulting from the difference between the relevant gate/source voltage less the relevant threshold value of both MOS transistors T1 and T2 are equally large. Due to the transition occurring at the output terminal $a$ from a voltage value (e.g., negative value) to another voltage value (e.g., positive value), it can thus be determined when, relatively speaking, the control voltages applied to the differential amplifier are equal. This is the case when, at the output terminal $x$, the switching voltage of the subsequent amplifier has just been exceeded or is just less than the given value.

If the control voltages appearing at the input terminals $e1$ and $e2$, viewed absolutely, are so different that with a given ratio of the voltages at the junction point $x$ the switching voltage of the subsequent amplifier is not obtained, then appropriate countermeasures have to be taken. As a rule, the shifting of the switch point of the amplifier is not taken into consideration, since this value is fixed with the chosen circuit construction of the amplifier. Rather, the measures must be taken in the differential amplifier itself. However, the application of a bias voltage to the gate electrode of one of the MOS differential amplifier transistors T1 and T2 making up the differential amplifier is frequently out of the question, since the bias battery required in this case sometimes brings about an unwanted capacitive load of the gate electrode circuit of the MOS transistor concerned. Moreover, such an additional bias arrangement, as a rule, is not readily applicable.

In order, nevertheless, to match the differential amplifier to the switching voltage of the amplifier under consideration, at least one of two measures can be taken. One measure consists in shifting the threshold voltage of at least one of the two MOS transistors T1 and T2 through ion implantation toward the threshold voltage of the other MOS transistor of the differential amplifier. This can be achieved through well known processes that can easily be controlled. The other measure consists in parallel-connecting at least one other MOS transistor of the other type to one of the MOS transistors T1 and T2 forming the differential amplifier in such a manner that corresponding electrodes of the parallel-connected MOS transistors are connected together. In the drawing, this is shown with reference to the MOS transistor T2.

The MOS transistor T3 can be connected in parallel to MOS transistor T2 in the manner indicated hereinabove and in the drawing. In this case, the MOS transistor T3 is a p-channel depletion MOS transistor. It is pointed out that the MOS transistor T2 was assumed to be a p-channel enhancement MOS transistor.

To some extent, as a result of one or both measures discussed hereinabove, a shifting of the $I_D$-$V_G$ characteristic curve of the MOS transistor arrangement important for one input of the differential amplifier is achieved to such a degree that control voltages differing from one another even by relatively small values can be operated upon or compared with one another. Thus, for example, it is possible by means of the circuit configuration shown in the drawing to compare a control voltage applied at the input terminal $e1$ and varying between $-2V$ and $+2V$ with a control voltage applied at the input terminal $e2$ and varying between, e.g., $-2V$ and $+2V$. The differential amplifier generates at its output terminal $x$ an output voltage of, e.g., 1V equivalent to the switching voltage of the subsequent amplifier both in the case where the control voltage at the input terminal $e1$ is $-2V$ and the control voltage at the input terminal $e2$ is $-2V$ and in the case where the control voltage at the input terminal $e1$ is $+2V$ and the control voltage at the input terminal $2e$ is $+2V$.

Within the range of variation of the control voltages at the input terminals $e1$ and $e2$ the linearity of the differential amplifier in question is excellent, as far as the generation of an output voltage equivalent to the switching voltage of the amplifier in the presence of appropriate control voltages is concerned. It is also possible, without further provisions and by means of the differential amplifier, to compare control voltages applied to the input terminals $e1$ and $e2$ in increments of 0.1 mV.

Finally, it should be noted that the differential amplifier described herein can be employed in the same way as hitherto known differential amplifiers (cf. "Elektronik", 1970, No. 5, pp. 145-148). The differential amplifier has a relatively high input resistance in excess of $10^{11}$ Ohm and a comparatively small input capacitance less than $\frac{1}{2}$ pF.

The principles of the invention are described hereinabove by describing the construction and operation of a preferred embodiment. It is to be noted that this described embodiment is considered to be only an exemplary construction, and it, along with its operating parameters, can be modified or changed, while remaining within the scope of the invention, as defined by the appended claims.

I claim:
1. A differential amplifier, comprising:
   supply voltage means,
   first and second metal oxide semiconductor (MOS) transistors of, respectively, the depletion and enhancement types, the source-drain paths of said transistors being connected in series at a common junction point such that the source terminal of said first transistor is connected to the drain terminal of said second transistor, the other terminals of said source-drain paths being connected to said supply voltage means, said transistors having control electrodes connected, respectively, directly to separate input voltages the difference between which is to be indicated and
   output terminal means connected to said common junction point for producing differential voltages corresponding to the difference between said input voltages.
2. The difference amplifier defined in claim 1 wherein said first and second MOS transistors are constructed to have threshold voltages such that when equal input voltages are applied to the control electrodes thereof, a predetermined differential voltage resulting from the gate/source voltages of said transistors less said threshold voltage is obtained.
3. The differential amplifier defined in claim 1 further comprising:
   a third MOS transistor of the depletion type having its source and drain electrodes connected to like electrodes of said second transistor and a control electrode connected to the control electrode of said second transistor.
4. The differential amplifier defined in claim 1 further comprising:
   amplifier means having an input connected to said output terminal means and an output terminal for producing a predetermined output signal when the input voltage to said amplifier means exceeds a predetermined switching value whereat said amplifier means switches from one state to another.
5. The differential amplifier defined in claim 4 wherein said amplifier means includes MOS transistors.
6. The differential amplifier defined in claim 1 further comprising:
   means for supplying an offset voltage connected to said common junction point.

* * * * *